(12) United States Patent
Yoshida et al.

(10) Patent No.: US 9,674,994 B2
(45) Date of Patent: Jun. 6, 2017

(54) WIRING HARNESS

(71) Applicant: Sumitomo Wiring Systems, Ltd., Yokkaichi, Mie (JP)

(72) Inventors: Keiichi Yoshida, Mie (JP); Hiroyuki Matsuoka, Mie (JP); Takuya Tate, Mie (JP)

(73) Assignee: SUMITOMO WIRING SYSTEMS, LTD., Yokkaichi, Mie (JP)

( * ) Notice: Subject to any disclaimer, the term of this patent is extended or adjusted under 35 U.S.C. 154(b) by 0 days.

(21) Appl. No.: 15/030,614

(22) PCT Filed: Oct. 30, 2014

(86) PCT No.: PCT/JP2014/078870
§ 371 (c)(1),
(2) Date: Apr. 20, 2016

(87) PCT Pub. No.: WO2015/072335
PCT Pub. Date: May 21, 2015

(65) Prior Publication Data
US 2016/0255750 A1    Sep. 1, 2016

(30) Foreign Application Priority Data

Nov. 12, 2013 (JP) .................................. 2013-233909
Nov. 12, 2013 (JP) .................................. 2013-233910

(51) Int. Cl.
*H01R 13/648* (2006.01)
*H05K 9/00* (2006.01)
(Continued)

(52) U.S. Cl.
CPC ......... *H05K 9/0098* (2013.01); *H01B 7/0045* (2013.01); *H01B 7/04* (2013.01); *H01R 13/6593* (2013.01); *H01R 9/032* (2013.01)

(58) Field of Classification Search
CPC .... H05K 9/0096; H01R 13/6593; H01R 9/03; H01B 7/0045; H01B 7/04
(Continued)

(56) References Cited

U.S. PATENT DOCUMENTS 6,837,728 B2 * 1/2005 Miyazaki ............... H01R 9/032
439/271
7,229,316 B2 * 6/2007 Takaku .............. H01R 13/6275
439/607.56
(Continued)

FOREIGN PATENT DOCUMENTS

JP    2002-313496    10/2002
JP    2004-119047    4/2004
(Continued)

OTHER PUBLICATIONS

International Search Report.

*Primary Examiner* — Sherman Ng
(74) *Attorney, Agent, or Firm* — Gerald E. Hespos; Michael J. Porco; Matthew T. Hespos

(57) ABSTRACT

A wiring harness (10) for connecting a first device and a second device includes a first shield connector (20) to be connected to the first device, a second shield connector (30) to be connected to the second device, wires (40) arranged between the first shield connector (20) and the second shield connector (30), and a shield (50) made of an electrically conductive metal cloth. After the wires (40) are arranged between the first shield connector (20) and the second shield connector (30), the sheet-like shield (50) is mounted to cover the wires (40), thereby shielding between the first and second devices.

8 Claims, 21 Drawing Sheets

(51) Int. Cl.
*H01R 13/6593* (2011.01)
*H01B 7/00* (2006.01)
*H01B 7/04* (2006.01)
*H01R 9/03* (2006.01)

(58) Field of Classification Search
USPC .......................................................... 174/359
See application file for complete search history.

(56) References Cited

U.S. PATENT DOCUMENTS

| | | | |
|---|---|---|---|
| 2004/0057187 A1 | 3/2004 | Kuboshima et al. | |
| 2005/0266729 A1* | 12/2005 | Fukushima | H01R 9/032 439/607.46 |
| 2012/0028500 A1 | 2/2012 | Lee et al. | |
| 2014/0248800 A1* | 9/2014 | Tanaka | H01R 12/777 439/607.01 |

FOREIGN PATENT DOCUMENTS

| | | |
|---|---|---|
| JP | 2004-327100 | 11/2004 |
| JP | 2012-521068 | 9/2012 |

\* cited by examiner

WIRING HARNESS

BACKGROUND

1. Field of the Invention

A technology disclosed by this specification relates to a wiring harness using a sheet-like shield member.

2. Description of the Related Art

Conventionally, a shield connector to be mounted and fixed to a shield case of a device is known, for example, from Japanese Unexamined Patent Publication No. 2002-313496. This shield connector includes a housing made of synthetic resin and a shield shell made of metal and covering this housing. Terminals are retained and held in the housing. The respective terminals are connected to ends of wires, and these wires are pulled out backward. A tubular shield member (e.g. braided wire) collectively covers the wires. This shield member is crimped to the shield shell with the wires inserted through the shield member in advance.

The above-described shield connector is provided, for example, on each of opposite end parts of a three phase wire connecting between an inverter and a motor. However, in the case of directly connecting the inverter to the motor, the wire connecting between these devices becomes shorter and a shield member cannot be crimped to the shield shells. Thus, it is not possible to shield between the devices. The shield member cannot be crimped for the following reason. A crimping operation generally is performed by a crimper. If the shield connectors are close to each other, the second shield connector enters a work area of the crimper on the first shield connector and the crimper interferes with the second shield connector when crimping the shield member to the shield shell of the first shield connector.

SUMMARY

A wiring harness disclosed in this specification is for connecting a first device and a second device. The wiring harness includes a first shield connector to be connected to the first device, a second shield connector to be connected to the second device, a wire arranged between the first and second shield connectors and a sheet-like shield made of an electrically conductive metal cloth. The sheet-like shield is mounted to cover the wire, thereby shielding between the first and second devices, after the wire is arranged between the first and second shield connectors.

According to this configuration, it is possible to shield between the first and second devices merely by mounting the sheet-like shield to cover the wire after the wire is arranged between the first and second shield connectors. In short, since the sheet-like shield can be retro-fitted between the first and second devices, it is not necessary to mount a tubular shield around a wire in advance, as before. Thus, it is possible to shield between the devices even if the wire connecting between the devices is short.

The following configurations are preferable as embodiments of the wiring harness disclosed in this specification.

A first bracket may be provided. The first bracket is made of an electrically conductive metal plate and includes a first shield connecting portion to be connected to the shield and a first case connecting portion to be connected to a first case constituting an outer surface of the first device. The shield may be connected to the first case via the first bracket by bolting the first case connecting portion to the first case. According to this configuration, an operation of connecting the sheet-like shield is facilitated since it is sufficient to connect the first shield member connecting portion to the shield and bolt the first case connecting portion to the first case in advance. This eliminates the need for cumbersome operations, such as an operation of directly connecting the shield to the first case.

Two of the first brackets may be provided and assembled with each other by folding the shield between the two first brackets after two of the first shield member connecting portions are connected side by side on a peripheral edge part of the shield member. According to this configuration, an operation of covering the wire by forming the sheet-like shield into a tubular shape is facilitated.

The two first shield connecting portions may be arranged to face each other and the shield may surround the wire over the entire circumference with the two first brackets assembled with each other. According to this configuration, an operation of winding the sheet-like shield around the wire is facilitated. Further, shielding performance by the shield can be enhanced.

Two of the first case connecting portions may be fastened together to the first case while being overlapped with each other with the two first brackets assembled with each other. According to this configuration, an operation of connecting the first bracket to the case is facilitated since the number of bolting operations to the first case is reduced.

The first shield connector may include a first housing made of resin and a first terminal connected to one end part of the wire and integrally formed with the first housing. The second shield connector may include a second housing made of resin and a second terminal connected to the other end part of the wire and integrally formed with the second housing. In a wiring harness in which first and second terminals connected to opposite end parts of a wire respectively are formed integrally with first and second housings, a tubular shield cannot be mounted around the wire in advance. That is because if the tubular shield member is mounted around the wire in advance after the first terminal is formed integrally with the first housing, the shield stands as an obstacle and resin molding cannot be performed due to the short wire even if an attempt is made to form the second terminal integrally with the second housing. Further, even if it is attempted to mount the tubular shield around the wire later after the first and second terminals are formed integrally with the first and second housings, the first and second housings stand as an obstacle and the shield cannot be mounted. In that respect, since the sheet-like shield is mounted around the wire later according to the above configuration, the shield does not stand as an obstacle in performing resin molding.

A second upper bracket and a second lower bracket including second shield connecting portions to be connected to the shield and second case connecting portions to be connected to a second case may be provided. The second case connecting portion of the second upper bracket may include a first shaft hole into which a shaft of a bolt is to be arranged and an introducing hole along which the shaft is to be introduced into the first shaft hole in a radial direction of the shaft. The second case connecting portion of the second lower bracket may include a second shaft hole into which the shaft is to be inserted in an axial direction of the shaft. According to this configuration, the second upper bracket can be mounted after the wire is arranged since the shaft of the bolt can be arranged into the first shaft hole in the radial direction of the shaft by being introduced along the introducing hole.

The second case connecting portion may be provided on each of opposite ends of the second upper bracket. An introducing direction of the shaft in the introducing hole of one of the second case connecting portions and that of the shaft in the introducing hole of the other second case connecting portion may be arranged to intersect. The shaft may be insertable into the introducing hole of the other second case connecting portion when the other second case connecting portion is rotated about the first shaft hole of the one second case connecting portion with the shaft arranged in the first shaft hole of the one second case connecting portion. According to this configuration, the second upper bracket can be reliably mounted on the shaft of the bolt even in an environment where the second upper bracket is difficult to see due to the wire since the second upper bracket can be mounted by a simple operation of rotating the other second case connecting portion about the first shaft hole of the one second case connecting portion.

The second case connecting portion of the second lower bracket may include a separation preventing piece for preventing the separation of the second upper bracket. According to this configuration, the separation of the second upper bracket can be prevented by the separation preventing piece with the second lower bracket mounted below the second upper bracket.

A metal plate for mounting the second upper and lower brackets on the second case may be provided. The second case connecting portion of the second lower bracket may include a positioning piece for positioning the second lower bracket and the metal plate may include a positioning receiving portion to be locked to the positioning piece. According to this configuration, the second lower bracket can be positioned by locking the positioning piece to the positioning receiving portion.

According to the wiring harness disclosed in this specification, it is possible to shield between devices even if a wire connecting between these devices is short.

DETAILED DESCRIPTION

An embodiment of the present invention is described with reference to FIGS. 1 to 20. A wiring harness 10 of this embodiment is a power cable for connecting between a motor (an example of a "first device" of the present invention, not shown) and an inverter (an example of a "second device" of the present invention, not shown). The inverter is directly connected to the motor, and an inverter-side terminal block (not shown) mounted on a case of the inverter and a motor-side terminal block (not shown) mounted on a case of the motor are arranged at a very short distance from each other. A first shield connector 20 is provided on one end of the wiring harness 10 and a second shield connector 30 is provided on the other end of the wiring harness 10. The first shield connector 20 is fitted and connected to the motor-side terminal block and the second shield connector 30 is fitted and connected to the inverter-side terminal block.

Figure 3:
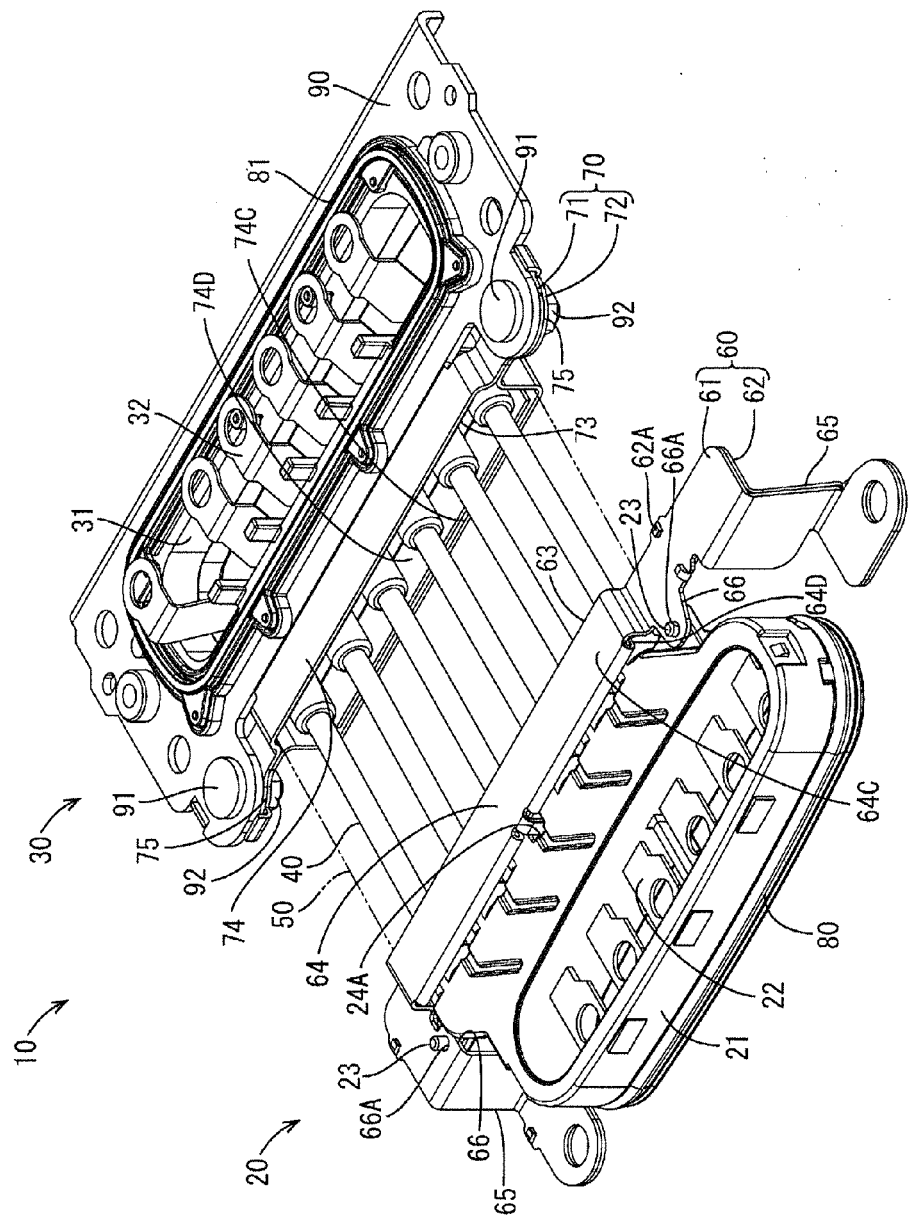
FIG. 3 is a perspective view showing an arranged state of wires passed through a shield of the wiring harness.
Figure 4:
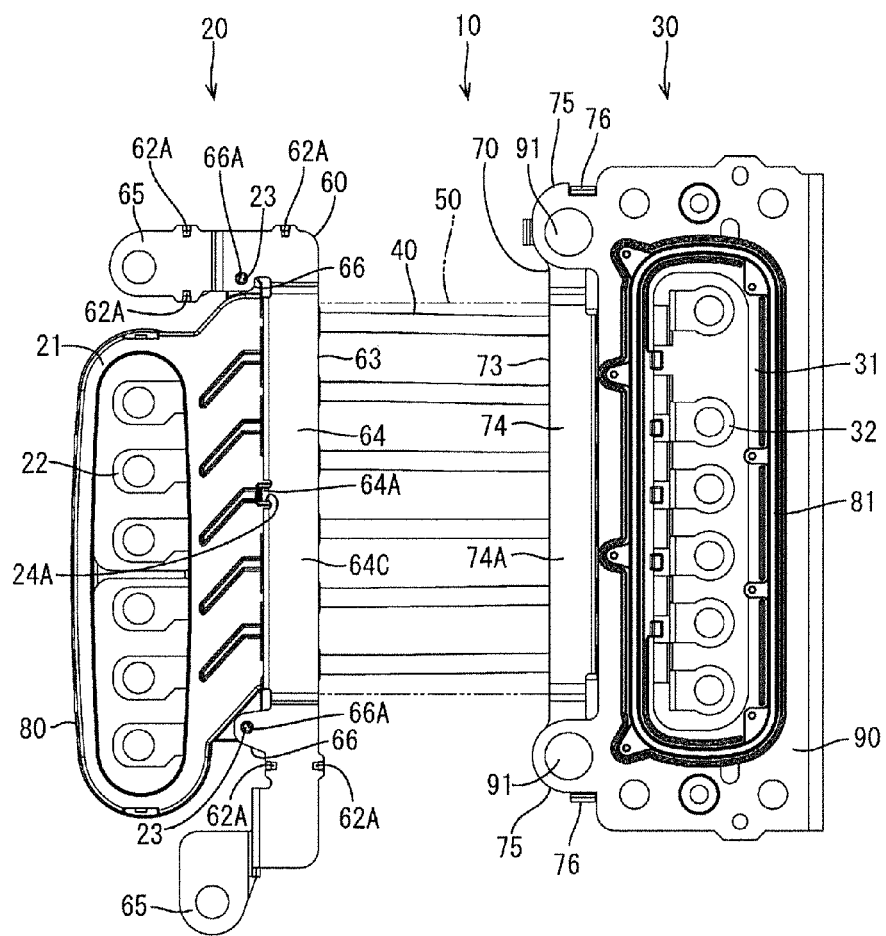
FIG. 4 is a plan view showing the arranged state of the wires passed through the shield of the wiring harness.
Figure 5:
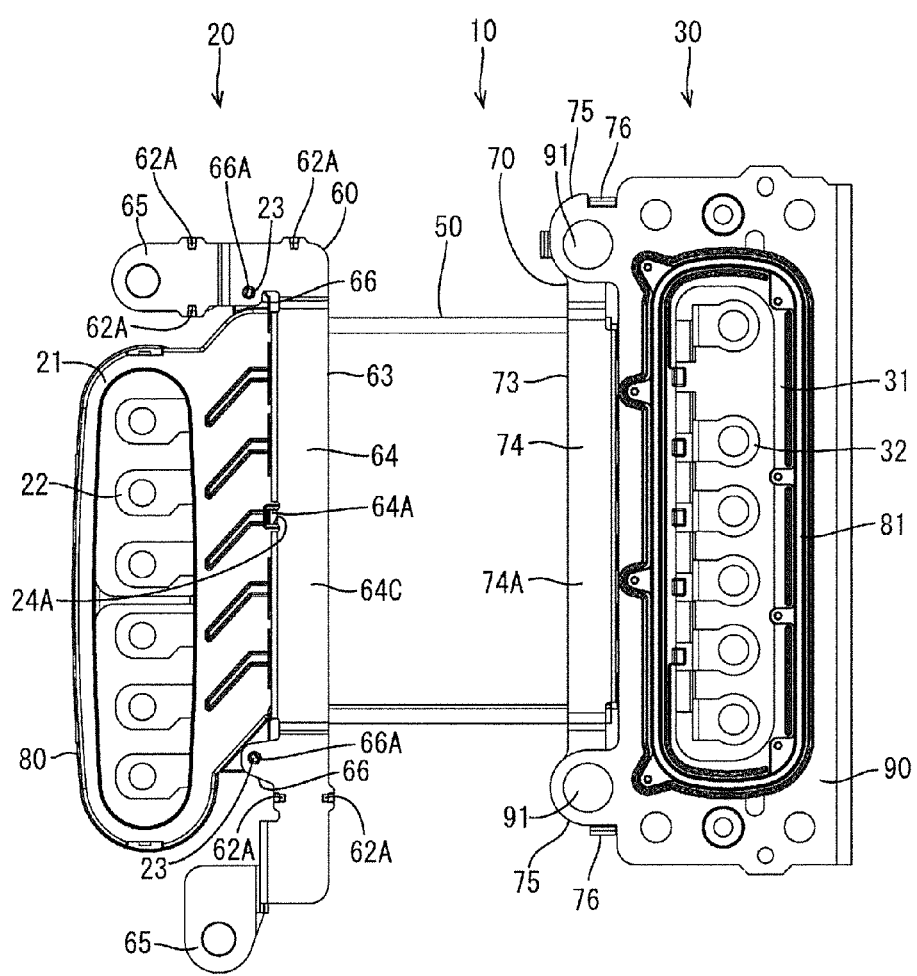
FIG. 5 is a plan view of the wiring harness.

As shown in FIG. 3, plural wires 40 (six in this embodiment) are arranged in parallel between the first and second shield connectors 20, 30. Each wire 40 is composed of a core formed by bundling a plurality of strands made of copper or copper alloy or aluminum or aluminum alloy and a coating made of insulating resin and covering this core. Further, the wire 40 is a large-diameter wire compatible with large-current application, but flexible to an extent to be bendable substantially at 90°. Since the plurality of wires 40 are arranged side by side in parallel without being bundled, it is possible to collectively bend the plurality of wires 40 substantially at 90°.

Figure 2:
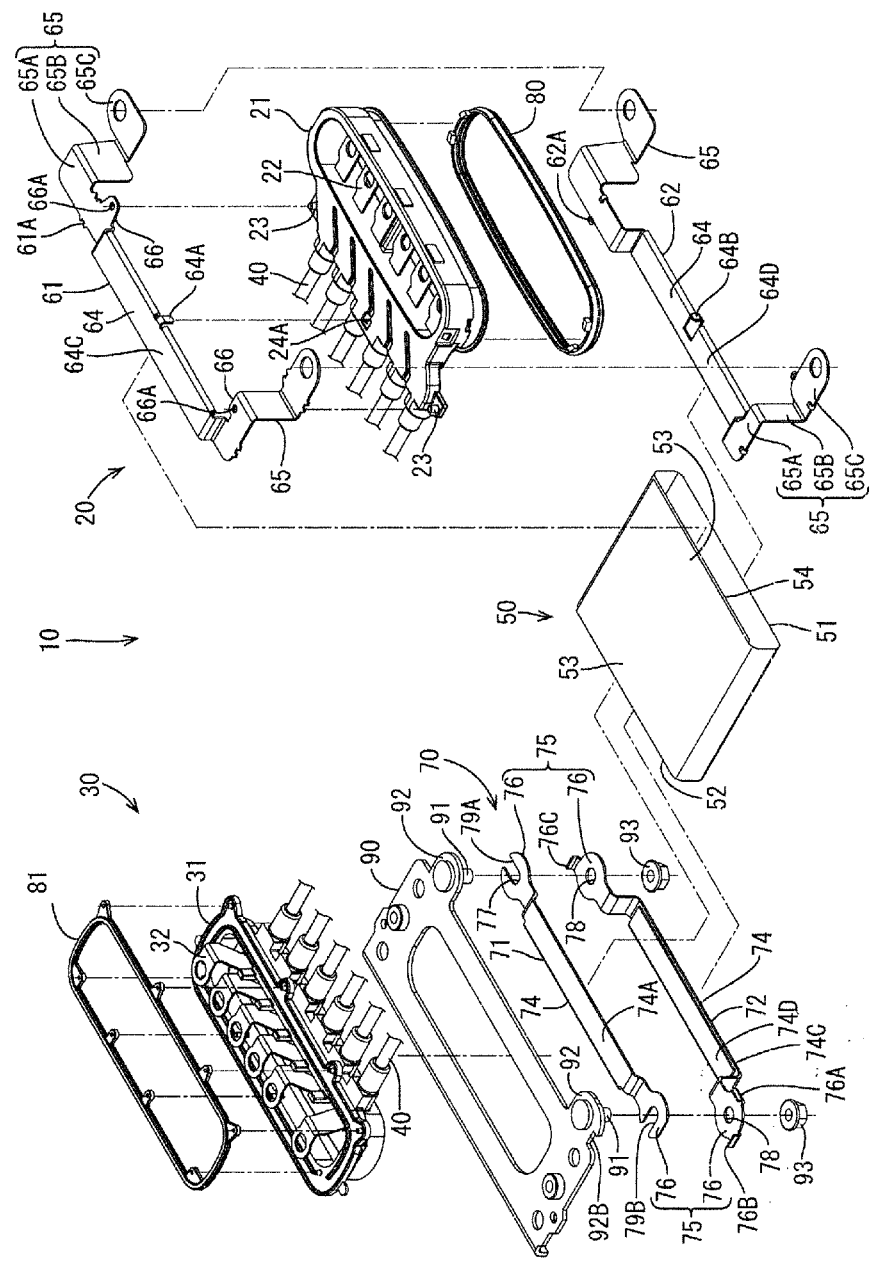
FIG. 2 is an exploded perspective view of the wiring harness.

Next, the configuration of the first shield connector 20 is described. As shown in FIG. 2, the first shield connector 20 includes a first housing 21 made of synthetic resin and first terminals 22 integrally formed with this first housing 21. The first housing 21 is fittable into a mounting hole (not shown) formed to penetrate through the case of the motor. A first seal ring 80 is fit on the outer peripheral surface of the first housing 21. When the first housing 21 is fit into the mounting hole of the case of the motor, the first seal ring 80 is sandwiched between the outer peripheral surface of the first housing 21 and the inner peripheral surface of the mounting hole, thereby sealing from the interior of the case of the motor to the interior of the first housing 21.

As shown in FIG. 2, a first bracket 60 composed of a first upper bracket 61 and a first lower bracket 62 is assembled with the first housing 21. The first bracket 60 includes a first tubular portion 63 (see FIG. 1), through which the wires 40 are passed collectively, with the first upper and lower brackets 61, 62 assembled with each other. Further, the first bracket 60 is formed by punching out an electrically conductive metal plate and bending the punched-out metal plate.

Figure 1:
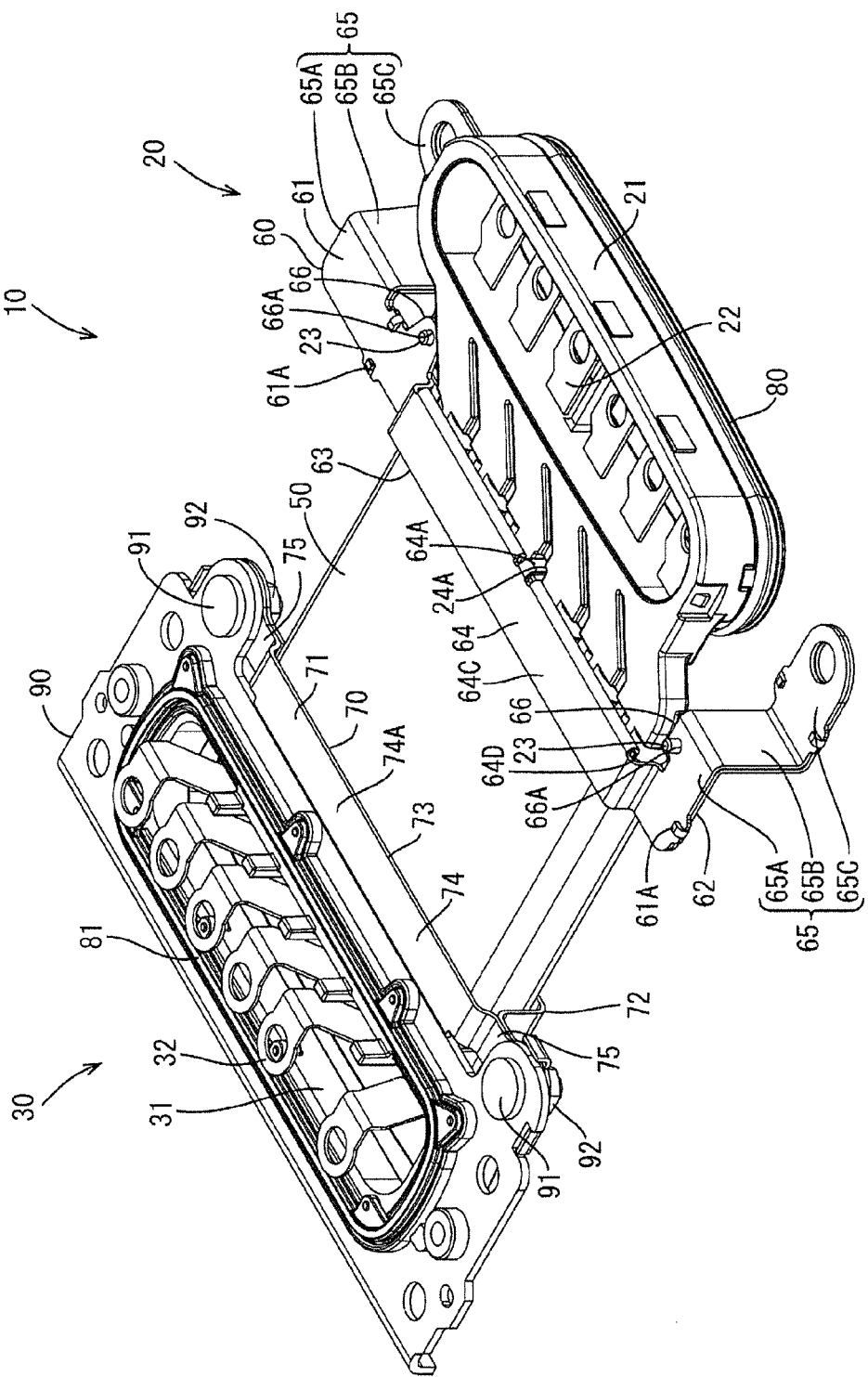
FIG. 1 is a perspective view of a wiring harness.

As shown in FIG. 1, upper and lower first shield connecting portions 64 are formed on facing long sides of the first tubular portion 63 and will be connected to one end part 51 of a shield 50 to be described later. These first shield connecting portions 64 are plate-like and arranged to face each other with the first upper and lower brackets 61, 62 assembled with each other as shown in FIG. 2.

Two first case connecting portions 65 protrude laterally on short facing side parts of the first tubular portion 63 and are to be bolted to the case constituting the outer surface of the motor. The first case connecting portions 65 are fastened together to the case of the motor. Each first case connecting portion 65 includes a horizontal portion 65A protruding in a horizontal direction from the first tubular portion 63, a vertical portion 65B protruding in a vertical direction from a side edge of this horizontal portion 65A and a fastening portion 65C protruding in the horizontal direction again from the tip of this vertical portion 65B. The horizontal portion 65A and the fastening portion 65C project in opposite directions from the vertical portion 65B. Further, the horizontal portion 65A and the fastening portion 65C are arranged in parallel with each other and also with the first shield connecting portions 64.

An overlapping part formed by overlapping the first case connecting portion 65 of the first upper bracket 61 and the first case connecting portion of the first lower bracket 62 includes hooking projections 62A formed on the first lower bracket 62 and hooking recesses 61A formed on the first upper bracket 61 as shown in FIG. 2. The hooking projections 62A and the hooking recesses 61A are provided separately on the horizontal portions 65A and the fastening portions 65C. Further, the hooking projections 62A and the hooking recesses 61A are formed on peripheral edges extending in a pull-out direction of the wires 40 and peripheral edges orthogonal to the former edges of the first case connecting portions 65. Thus, by fitting and hooking the hooking projections 62A to the hooking recesses 61A, the first case connecting portions 65 are integrated and held in an overlapping state and the first shield connecting portions 64 are arranged to face each other, thereby configuring the first tubular portion 63.

Further, come-off preventing portions 66 protrude toward the first housing 21 from peripheral edges of the horizontal portions 65A of the first case connecting portions of the first upper bracket 61. A hole 66A penetrates through the come-off preventing portion 66. On the other hand, retaining projections 23 to be inserted through the holes 66A of the come-off preventing portions 66 are formed on the outer peripheral surface of the first housing 21.

As shown in FIG. 2, an upper mounting projection 64A is formed on a side edge of the first shield connecting portion 64 of the first upper bracket 61. This upper mounting projection 64A projects down in a center of a long side part of the first shield connecting portion 64. On the other hand, an upper mounting hole 24A into which the upper mounting projection 64A is to be inserted is formed to open up on the upper surface of the first housing 21.

Similarly, a lower mounting projection 64B is formed on a side edge of the first shield connecting portion 64 of the first lower bracket 62. This lower mounting projection 64B projects up in a center of a long side part of the first shield connecting portion 64. On the other hand, a lower mounting hole (not shown) into which the lower mounting projection 64B is to be inserted is formed on the lower surface of the first housing 21.

With the upper mounting projection 64A inserted in the upper mounting hole 24A and the lower mounting projection 64B inserted in the lower mounting hole, the first bracket 60 is movable a predetermined distance in the vertical direction. Further, with the retaining projections 23 respectively inserted in the holes 66A of the come-off preventing portions 66, the first bracket 60 is movable a predetermined distance in the horizontal direction. Thus, with the first bracket 60 fixed to the case of the motor, the first shield connector 20 is permitted to move the predetermined distances in the vertical and horizontal directions, but is not separated from the first bracket 60.

Next, the configuration of the second shield connector 30 is described. As shown in FIG. 2, the second shield connector 30 includes a second housing 31 made of synthetic resin and second terminals 32 integrally formed with this second housing 31. A plate-like metal plate 90 is mounted on the second shield connector 30 and the second shield connector 30 is fixed to the case of the inverter by bolting this metal plate 90 to the case of the inverter.

Further, a second seal ring 80 is mounted on the second housing 31. As the metal plate 90 is bolted to the case of the inverter, the second seal ring 81 is sandwiched between the metal plate 90 and the outer surface of the case of the inverter, thereby sealing from the interior of the case of the inverter to the interior of the second housing 31.

Figure 10:
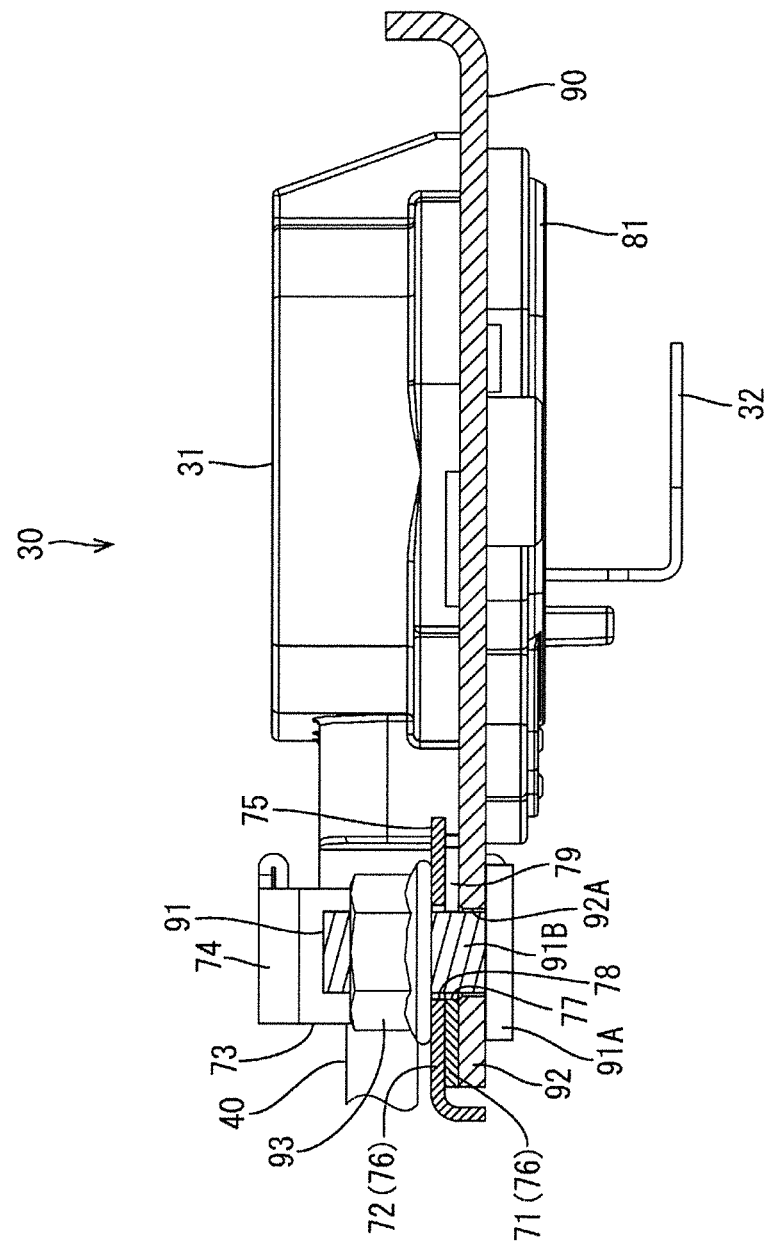
FIG. 10 is a section along A-A of FIG. 8.

The motor 90 has a rectangular outer shape and is formed integrally with the second housing 31, and two flanges 92 project on a long side edge of the metal plate 90. The respective flanges 92 project in a direction orthogonal to an extending direction of the long sides of the metal plate 90 and are arranged in parallel to each other. A bolt 91 is fixed to each flange 92. As shown in FIG. 10, this bolt 91 has a known configuration with a head 91A and a shaft 91B projecting from this head 91A. The shaft 91B is arranged to penetrate through a bolt mounting hole 92A formed on the flange 92 from a lower side to an upper side of FIG. 10, and the head 91A comes into contact with and is fixed to a peripheral edge part of the bolt mounting hole 92A from the lower side of FIG. 10.

As shown in FIG. 3, a second bracket 70 composed of a second upper bracket 71 and a second lower bracket 72 is fastened to the respective flanges 92 of the metal plate 90 by a pair of bolts 91. The second bracket 70 includes a second tubular portion 73, through which the wires 40 are to be inserted collectively, with the second upper and lower brackets 71, 72 assembled with each other. Further, the second upper and lower brackets 71, 72 are formed by punching out an electrically conductive metal plate and bending the punched-out metal plate. Note that the second bracket 70 to be mounted on the side of the heads 91A of the bolts 91 is the second upper bracket 71.

A shield connector using a bracket is known, for example, from Japanese Unexamined Patent Publication No. 2013-110079. This shield connector includes a housing made of synthetic resin and a shield shell made of metal and covering this housing. This shield shell is formed with a tubular portion on which a tubular braided wire collectively covering a plurality of wires is to be mounted. By fitting the braided wire on the outer periphery of the tubular portion and fastening a pair of fixing pieces from an outer peripheral side of the braided wire, the braided wire is crimped to the tubular portion.

A male piece and a female piece detachably engageable with each other are provided on one ends of the pair of fixing pieces, and flanges fastenable to each other by a screw are provided on the other ends of the pair of fixing pieces. Each flange is formed with a through hole for allowing the passage of a shaft portion of the bolt. This through hole is a closed hole and a hole edge part of the through hole is continuous over the entire circumference. Thus, in assembling the bracket, one fixing piece is mounted on a stud bolt, the wires are arranged on the one fixing piece and the other fixing piece is mounted on the stud bolt from above the wires.

However, in this embodiment, the wires 40 are arranged first and the second bracket 70 subsequently is retro-fitted. Even if an attempt is made to mount the fixing piece mounted below the wires 40 to the bolts 91, the wires 40 stand as an obstacle and the fixing piece cannot be mounted on the bolts 91. Thus, in this embodiment, the second bracket 70 is mounted on the bolts 91 without using any fixing piece. A specific structure is described below using FIGS. 6 to 14.

Two facing side parts constituting the long sides of the second tubular portion 73 are formed by assembling the second upper and lower brackets 71, 72 and have upper and lower second shield member connecting portions 74 to which another end part 52 (see FIG. 2) of the shield member 50 to be described later is to be connected. These second shield connecting portions 74 are plate-like and arranged to face each other with the second upper and lower brackets 71, 72 assembled with each other as shown in FIG. 3. On the other hand, left and right plate connecting portions 75 to be fastened together to the metal plate 90 protrude laterally on two facing side parts constituting short sides of the second tubular portion 73. As shown in FIG. 10, this plate connecting portion 75 is configured specifically by overlapping two second case connecting portions 76, a first shaft hole 77 and a second shaft hole 78 are formed coaxially on this overlapping part, and the second case connecting portions 76 are fastened together to the metal plate 90 by inserting the bolt 91 of the metal plate 90 into these shaft holes 77, 78 and fastening a nut 93.

Figure 11:
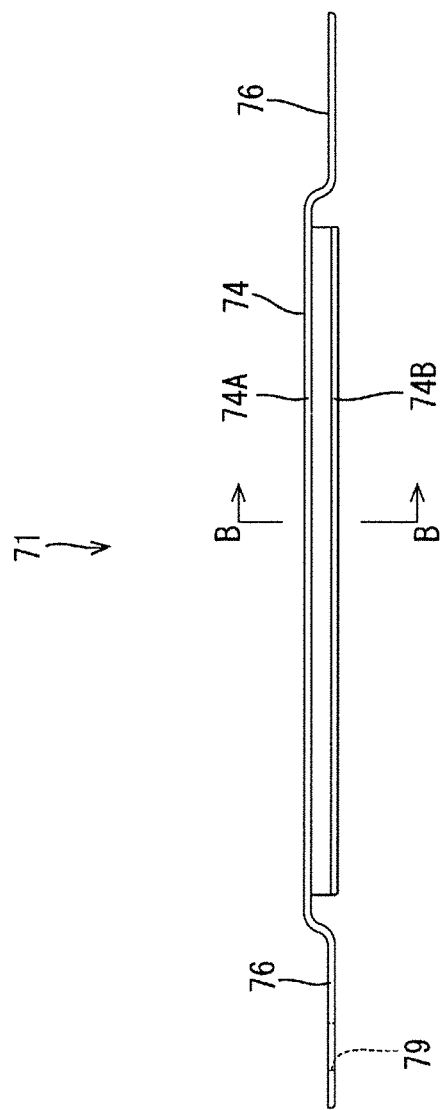
FIG. 11 is a front view of the second upper bracket.
Figure 12:
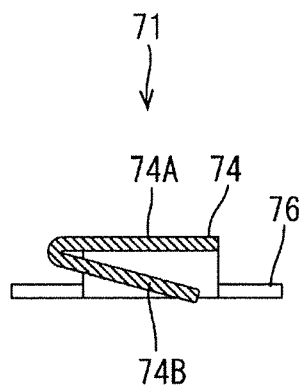
FIG. 12 is a section along B-B of FIG. 11.
Figure 13:
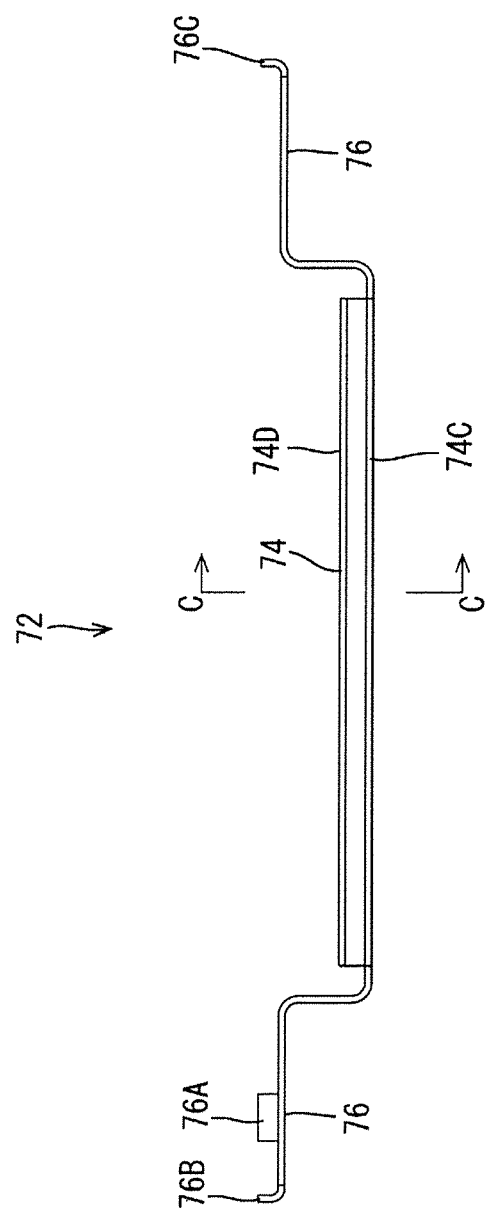
FIG. 13 is a front view of the second lower bracket.
Figure 14:
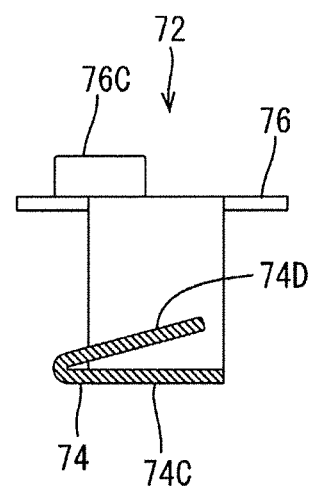
FIG. 14 is a section along C-C of FIG. 13.

As shown in FIG. 11, the second case connecting portions 76 of the second upper bracket 71 are provided at opposite sides of the second shield connecting portion 74. Further, as shown in FIG. 12, the second shield member connecting portion 74 of the second upper bracket 71 includes a second upper base plate 74A and a second upper crimping piece 74B coupled at an acute angle to this second upper base plate 74A. Similarly, as shown in FIG. 11, the second case connecting portions 76 of the second lower bracket 72 are provided at opposite sides of the second shield connecting portion 74. Further, as shown in FIG. 14, the second shield member connecting portion 74 of the second lower bracket 72 includes a second lower base plate 74C and a second lower crimping piece 74D coupled at an acute angle to this second lower base plate 74C.

Figure 6:
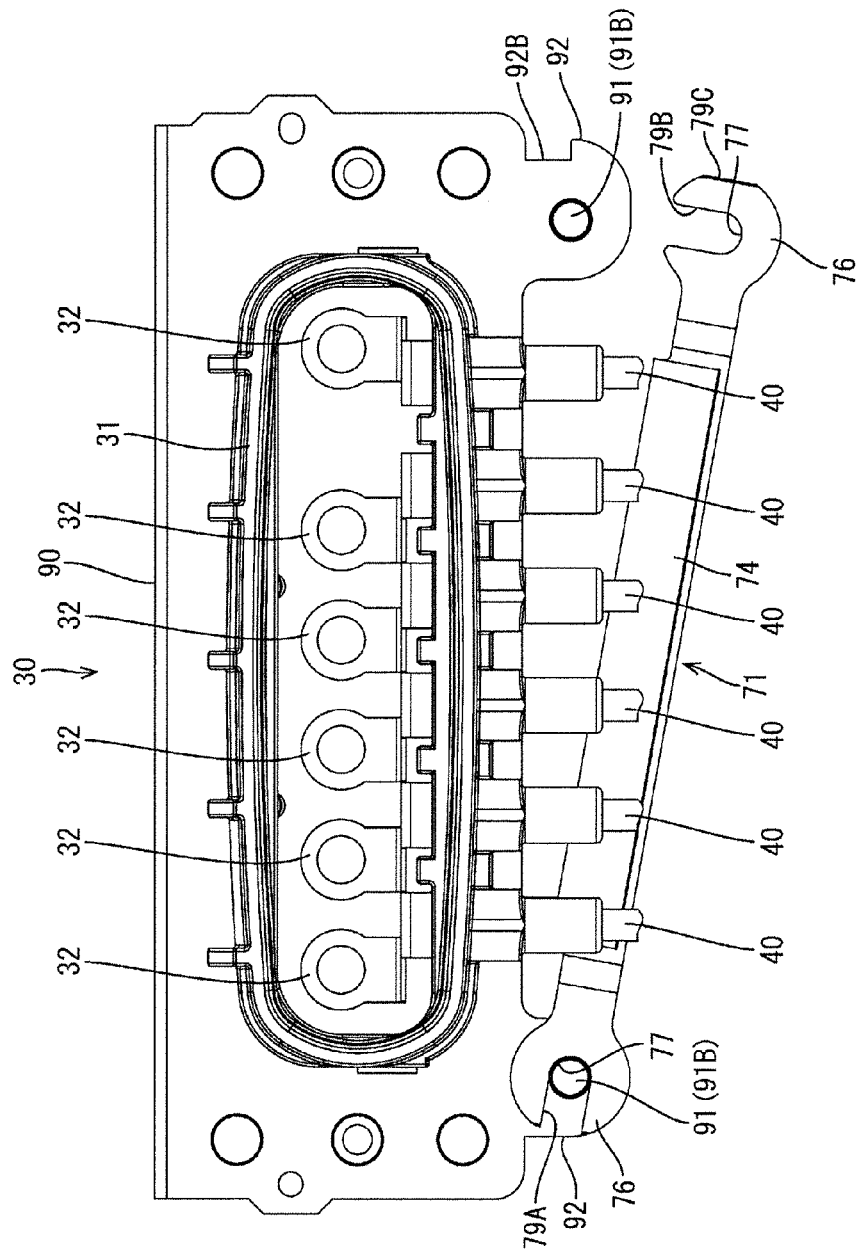
FIG. 6 is a bottom view showing an intermediate state while a second upper bracket is being mounted on a metal plate.

As shown in FIG. 6, a lateral introducing hole 79A and a longitudinal introducing hole 79B for introducing the shafts 91B of the bolts 91 into the first shaft holes 77 are open on the respective second case connecting portions 76 of the second upper bracket 71. Both of the lateral introducing hole 79A and the longitudinal introducing hole 79B have a width equal to a diameter of the first shaft holes 77 and are formed by cutting off peripheral edge parts of the first shaft holes 77 in a radial direction. The lateral introducing hole 79A shown on a left side of FIG. 6 is cut in a long side direction of the second shield connecting portion 74, whereas the longitudinal introducing hole 79B shown on a right side of FIG. 6 is cut in a short side direction of the second shield connecting portion 74. Specifically, the lateral introducing hole 79A and the longitudinal introducing hole 79B are arranged orthogonally. In other words, an introducing direction of the shaft 91B in the lateral introducing hole 79A of the second case connecting portion 76 shown on the left side of FIG. 6 and that of the shaft 91B in the longitudinal introducing hole 79B of the second case connecting portion 76 shown on the right side of FIG. 6 are orthogonal. Note that an outer peripheral edge part of the case connecting portion 76 shown on the right side of FIG. 6 is cut in the same direction as a cutting direction of the longitudinal introducing hole 79B, thereby forming an escaping edge 79C.

Figure 7:
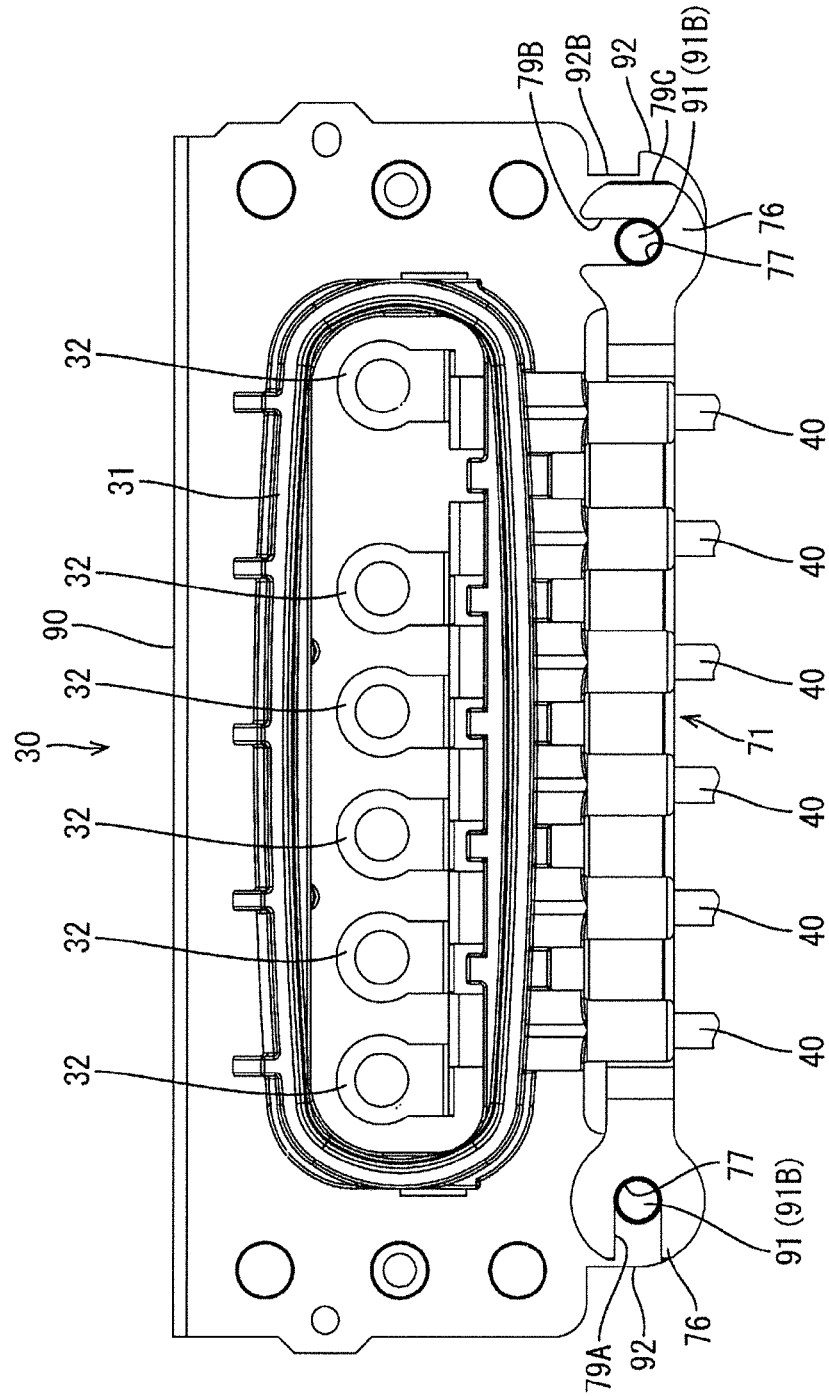
FIG. 7 is a bottom view showing a state where the second upper bracket is mounted on the metal plate.

As shown in FIG. 6, the second upper bracket 71 is formed such that, after the shaft 91B of the bolt 91 shown on the left side is introduced into the first shaft hole 77 from the lateral introducing hole 79A, the second case connecting portion 76 on the side of the longitudinal introducing hole 79B can be rotated about this introduced shaft portion 91B. Then, as shown in FIG. 7, the shaft 91B of the bolt 91 shown on the right side is introduced into the first shaft hole 77 from the longitudinal introducing hole 79B. At this time, the escaping edge 79C is arranged inwardly of a cut portion 92B of the metal plate 90.

Figure 8:
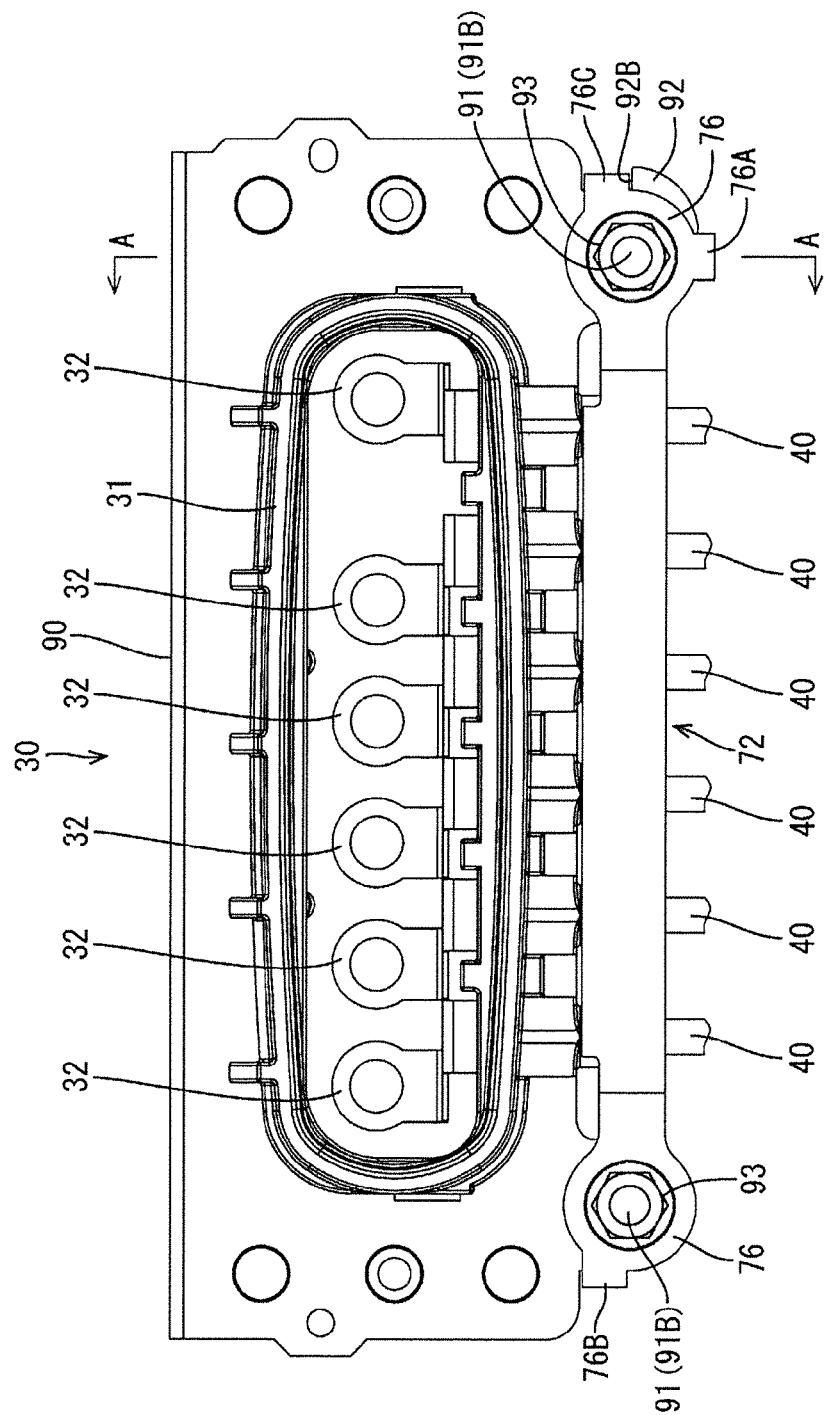
FIG. 8 is a bottom view showing a state where a second lower bracket is mounted on the metal plate.
Figure 9:
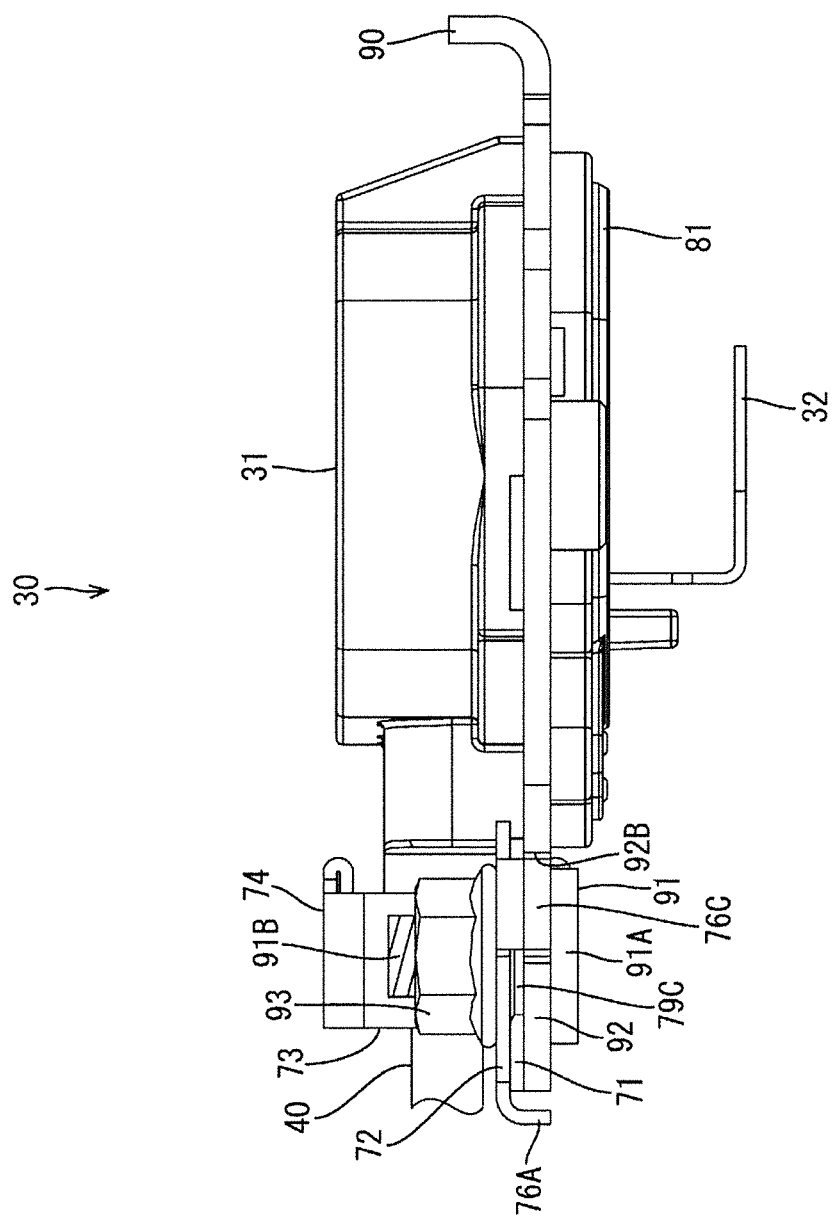
FIG. 9 is a side view of a second shield connector.

As shown in FIG. 2, each second shaft hole 78 of the second lower bracket 72 is a closed hole and a hole edge part of the second shaft hole 78 is continuous over the entire circumference. When the second lower bracket 72 is mounted on a front side of the second upper bracket 71, as shown in FIG. 8, the right second case connecting portion 76 of the second upper bracket 71 is supported by a separation preventing piece 76A, a first positioning piece 76B contacts the left flange 92 from the left and a second positioning piece 76C contacts the cut portion 92B of the right flange 92 from the right. In this way, the second lower bracket 72 is positioned and arranged with respect to the respective flanges 92 of the metal plate 90 by the respective positioning pieces 76B, 76C. Note that the escaping edge 79C of the second upper bracket 71 is not in contact with the second positioning piece 76C of the second lower bracket 72.

The second upper bracket 71 is held in a mounting posture of FIG. 7 by the separation preventing piece 76A. Since a diameter of the shafts 91B of the bolts 91 is substantially equal to or slightly smaller than that of the first shaft holes 77, the second upper bracket 71 is held in the mounting posture of FIG. 7 in a backlash-free state. Thus, with the second lower bracket 72 mounted below the second upper bracket 71, not only the second lower bracket 72, but also the second upper bracket 71 are positioned and arranged. This can prevent the second upper and lower brackets 71, 72 from being bolted in an inclined state when the nuts 93 are fastened to the shafts 91B of the bolts 91, as shown in FIG. 8. Further, when the nuts 93 are fastened to the shafts 91B of the bolts 91, the second case connecting portions 76 of the second upper bracket 71, the case connecting portions 76 of the second lower bracket 72 and the flanges 92 of the metal plate 90 are sandwiched and fastened together between the heads 91A of the bolts 91 and the nuts 93, as shown in FIG. 10.

The shield 50 is made of an electrically conductive metal cloth and is a woven fabric formed by weaving metal threads unlike a so-called braided wire. Specifically, metal threads are crossed in X shape in the braided wire, whereas a plurality of metal threads are composed of yarns and wefts and crisscrossed in the metal cloth. Thus, the metal threads easily become loose in the braided wire, whereas the metal cloth is not frayed. Such a metal cloth is, for example, a fabric having a network structure woven by crossing metal threads mainly containing copper in longitudinal and lateral directions. Further, the metal cloth may be structured by adhering a flexible film made of a resin material to a fabric of metal threads.

Figure 18:
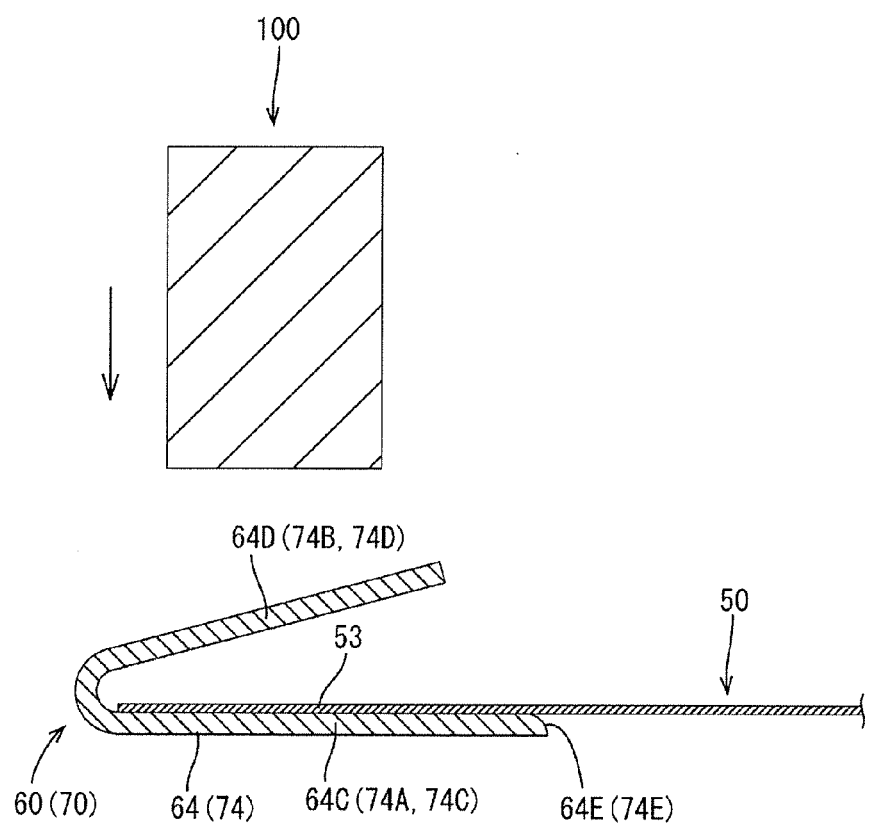
FIG. 18 is a perspective view simply showing a state before the shield connecting portion is crimped to the peripheral edge part of the shield by a crimper.

As shown in FIG. 18, the first shield connecting portion 64 includes a first base plate 64C and a first crimping piece 64C coupled at an acute angle to this first base plate 64C. First chamfering 64E is applied to a tip inner side of the first base plate 64C. Similarly, the second shield member connecting portion 74 includes the second upper base plate 74A and the second lower base plate 74C and the second upper crimping piece 74B and the second lower crimping piece 74D coupled at an acute angle to the second upper and lower second base plates 74A, 74C, and second chamfering 74E is applied to tip inner sides of the second upper and lower base plates 74A, 74C. The first case connecting portions of the first bracket 60 are provided at opposite sides of the first base plates 64C, and the second case connecting portions 76 of the second bracket 70 are provided at opposite sides of the second upper and lower base plates 74A, 74C.

Figure 19:
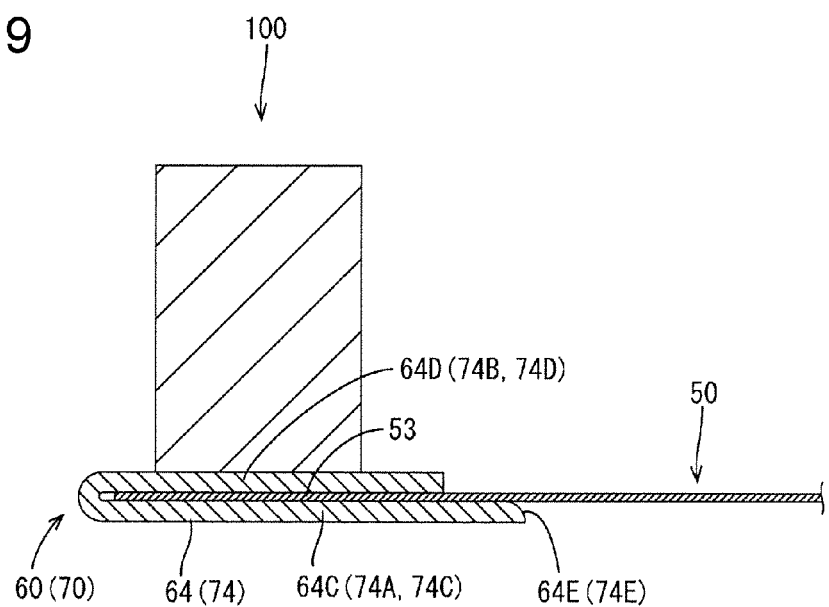
FIG. 19 is a perspective view simply showing a state where the shield connecting portion is crimped to the peripheral edge part of the shield member by the crimper.
Figure 20:
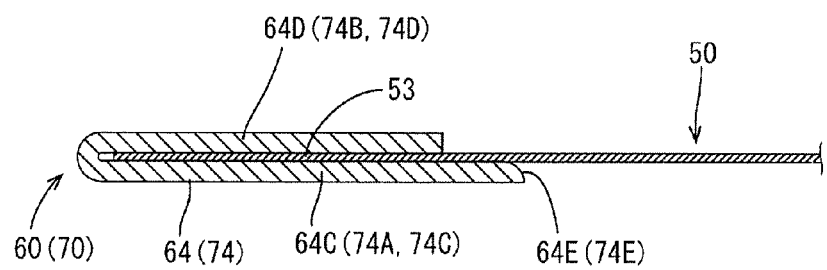
FIG. 20 is a perspective view simply showing a state after the shield connecting portion is crimped to the peripheral edge part of the shield by the crimper.

A crimping method of the shield 50 is described briefly below. As shown in FIG. 18, a peripheral edge 53 of the shield 50 is inserted between the first base plate 64C and the first crimping piece 64D and placed on the first base plate 64C and a crimper 100 is lowered from above the first crimping piece 64D. Then, as shown in FIG. 19, the first crimping piece 64D is crimped to the peripheral edge part 53 of the shield 50. Then, when the crimper 100 is elevated and the shield 50 is taken out of the crimper 100 as shown in FIG. 20, the first crimping piece 64D is crimped and the peripheral edge part 53 of the shield 50 is fixed in a state sandwiched between the first base plate 64C and the first crimping piece 64D. Similarly, the peripheral edge part 53 of the shield 50 is fixed in a state sandwiched between the second upper and lower base plates 74A, 74C and the second upper and lower crimping pieces 74B, 74D. In this way, the shield 50 is connected to the case of the motor via the first bracket 60 and to the case of the inverter via the second bracket 70.

The first base plate 64C is longer than the first crimping piece 64D. Thus, the shield 50 easily contacts the tip of the first base plate 64C. However, the first chamfering 64E is applied to the tip of the first base plate 64C. Therefore, the shield 50 is not damaged. Similarly, the second upper and lower base plates 74A, 74C are longer than the second upper and lower crimping pieces 74B, 74D.

Figure 15:
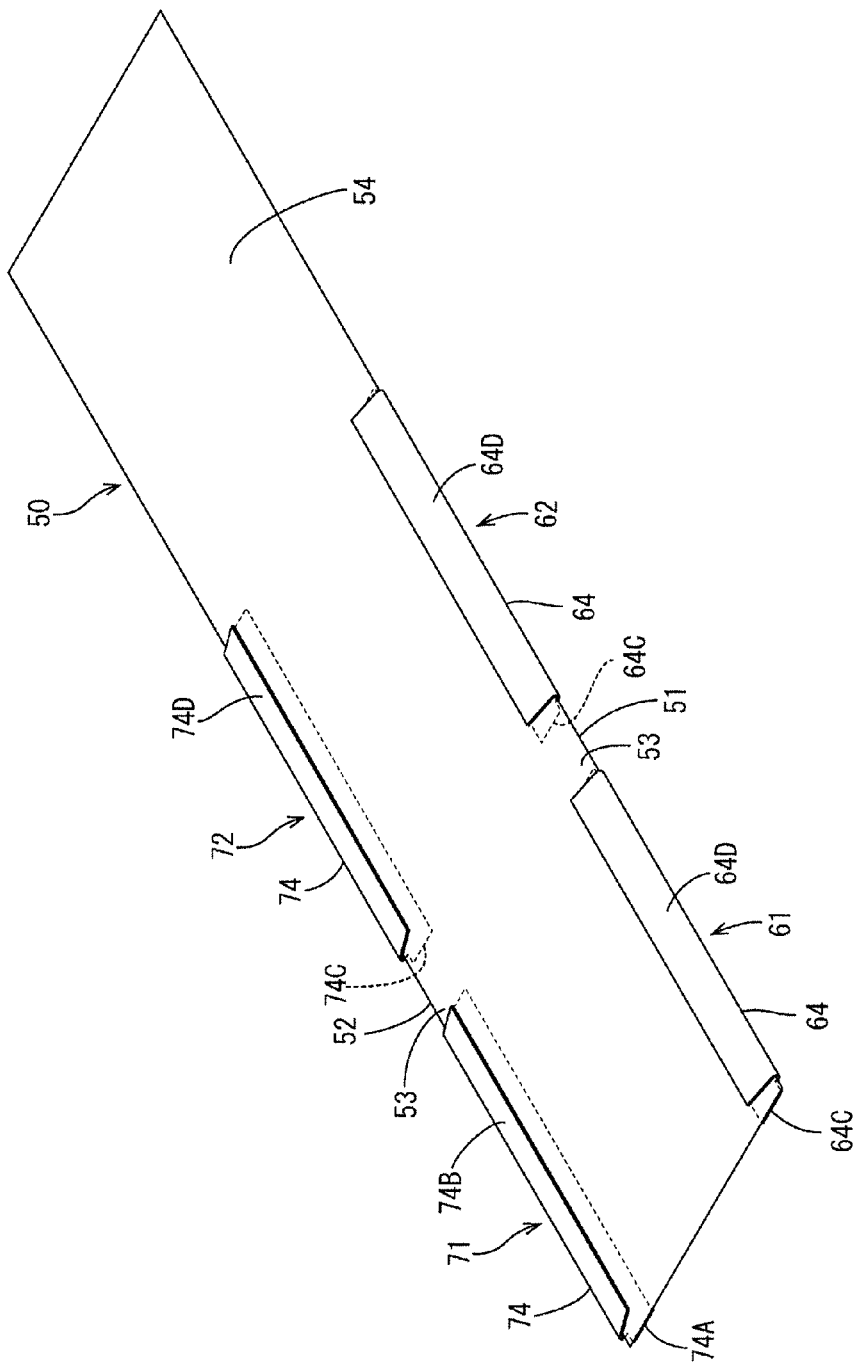
FIG. 15 is a perspective view simply showing a state where shield connecting portions are arranged on peripheral edge parts of the shield.
Figure 16:
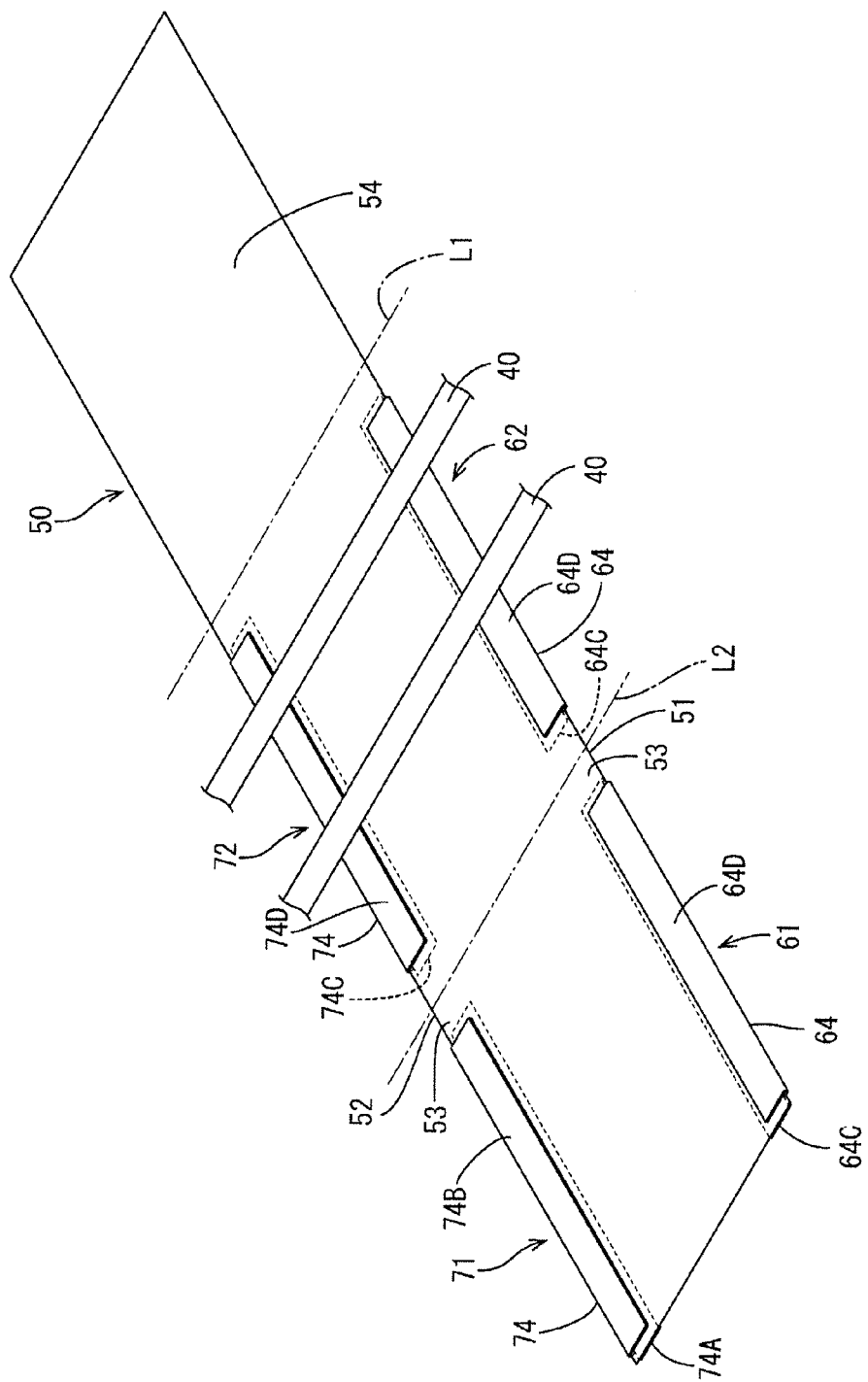
FIG. 16 is a perspective view simply showing a state where the shield connecting portions are crimped to the peripheral edge parts of the shield and located below the wires.

Next, a method for retro-fitting the shield 50 to the first and second shield connectors 20, 30 by winding the shield 50 around the wires 40 is described with reference to FIGS. 15 to 17. First, the wires 40 are arranged between the first and second shield connectors 20, 30 by forming the respective terminals 22, 32 with the respective housings 21, 31 by molding. As shown in FIG. 15, the first upper and lower brackets 61, 62 are arranged side by side on the peripheral edge part 53 of the one end 51 of the shield 50. Similarly, the second upper and lower brackets 71, 72 are arranged side by side on the peripheral edge part 53 of the other end part 52 of the shield 50.

Subsequently the crimping pieces 64D, 74B and 74D of the respective brackets 61, 62, 72 and 72 are crimped by the crimper, and the respective shield connecting portions 64, 74 are crimped to the peripheral edge part 53 of the shield 50. In this way, the first upper and lower brackets 61, 62 are connected side by side on the peripheral edge part 53 of the one end part 51 of the shield 50 and the second upper and lower brackets 71, 72 are connected side by side on the peripheral edge part 53 of the other end part 52 of the shield member 50. Thereafter, as shown in FIG. 16, the shield 50 is passed below the plurality of wires 40 and so arranged that the plurality of wires 40 traverse above the first and second lower brackets 62, 72.

After an extra length part 54 of the shield 50 not connected to the respective brackets 61, 62, 71 and 72 is folded (near a folding line L1 of FIG. 16) and placed above the wires 40, the shield 50 is folded between the upper brackets 61, 71 and the lower brackets 62, 72 (near a folding line L2 of FIG. 16) and the first and second upper brackets 61, 71 are placed above the wires 40.

Figure 17:
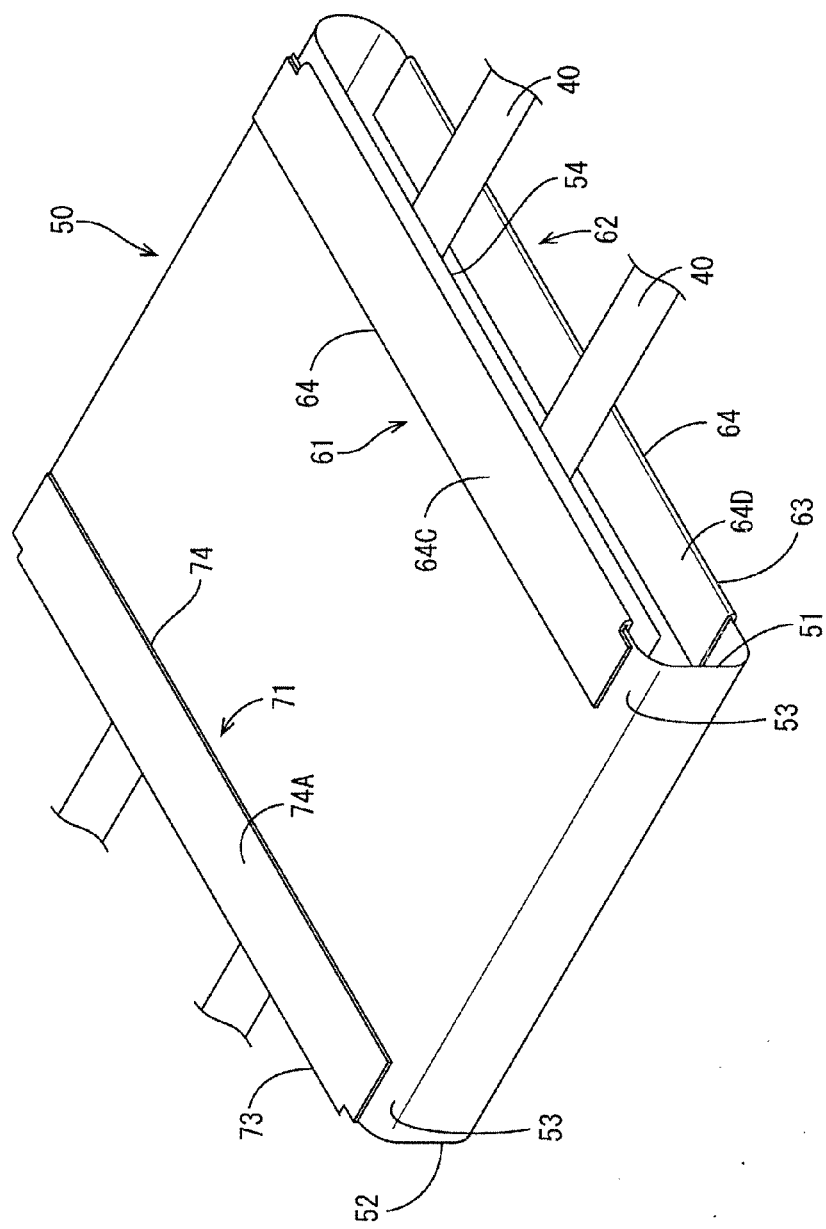
FIG. 17 is a perspective view simply showing a state where the shield having the shield connecting portions crimped thereto is surrounding the wires.

Then, as shown in FIG. 17, the shield 50 is formed into a tubular shape as a whole with the extra length part 54 folded inside the shield 50. In this way, the first upper and lower brackets 61, 62 are arranged to face each other and the peripheral edge part 53 of the one end part 51 of the shield 50 is wound around the wires 40 over the entire circumference. Further, the second upper and lower brackets 71, 72 are arranged to face each other and the peripheral edge part 53 of the other end part 52 of the shield 50 is wound around the wires 40 over the entire circumference. At that time, the respective brackets 61, 62, 71 and 72 are assembled with the respective shield connectors 20, 30. In this way, the shield 50 is wound around the wires 40 and retro-fitted to the respective shield connectors 20, 30.

On the other hand, the second bracket 70 is fixed to the metal plate 90 at the same time as the shield 50 is wound around the wires 40 and retro-fitted to the first and second shield connectors 20, 30. This fixing method is described using FIGS. 6 and 7. When the second bracket 70 is crimped to the peripheral edge part of the shield 50, the shield 50 is sheet-like and the second upper and lower brackets 71, 72 are arranged side by side. Thus, the second upper bracket 71 is mounted on the metal plate 90 while being passed below (back side of the plane of FIG. 6) the wires 40.

Subsequently, as shown in FIG. 6, the shaft 91B of the bolt 91 is introduced into the lateral introducing hole 79A of the second upper bracket 71 and the shaft 91B is arranged in the first shaft hole 77 when reaching the back end of the lateral introducing hole 79A. When the second upper bracket 71 is rotated about the shaft 91B thereafter, the shaft 91B of the other bolt 91 is introduced into the longitudinal introducing hole 79B and the other shaft 91B is arranged in the other first shaft hole 77 when reaching the back end of the longitudinal introducing hole 79B, as shown in FIG. 7. Note that the position of the second upper bracket 71 is made invisible by the metal plate 90 and the wires 40 when these operations are performed. However, since the second upper bracket 71 is mounted by being rotated after the shaft 91B is arranged in the one first shaft hole 77, positioning is easy and the operations are easily performed even in an invisible state.

With the second upper bracket 71 kept arranged at a predetermined position, the second lower bracket 72 is turned upside down and moved to a top side of the wires 40 (front side of the plane of FIG. 7). In this way, the respective shaft holes 78 of the second lower bracket 72 are fitted onto the shafts 91B of the respective bolts 91 from the front side to the back side (in an axial direction of the shafts 91B) while the shield 50 is formed into a tubular shape. Then, as shown in FIG. 6, the separation of the second upper bracket 71 is prevented by the separation preventing piece 76A and the respective second brackets 71, 72 are positioned and held by the respective positioning pieces 76B, 76C. Then, by fastening the nuts 93 respectively to the shafts 91B, the second upper and lower brackets 71, 72 are fastened together to the metal plate 90, whereby the second tubular portion 73 is configured and the tubular shield 50 is configured as shown in FIG. 3.

As described above, in this embodiment, it is possible to shield between the motor and the inverter only by covering the wires 40 with the sheet-like shield 50 after the wires 40 are arranged between the first and second shield connectors 20, 30. In short, since the sheet-like shield 50 can be retro-fitted between the motor and the inverter, it is not necessary to insert the wires 40 through a tubular shield member in advance as before. Thus, even if the wires 40 connecting between the devices are short, it is possible to shield between these devices.

Further, the first bracket 60 may be provided which is made of the electrically conductive metal plate and includes the first shield connecting portion 64 to be connected to the shield 50 and the first case connecting portions to be connected to the case configuring the outer surface of the motor, and the shield 50 may be connected to the case via the first bracket 60 by bolting the first case connecting portions 65 to the case. According to this configuration, it is sufficient to connect the first shield connecting portions 64 to the shield 50 and bolt the first case connecting portions 65 to the case in advance. Thus, the sheet-like shield 50 is connected easily. This eliminates the need for cumbersome operations such as an operation of directly connecting the shield 50 to the case.

The first upper and lower brackets 61, 62 may be provided and assembled with each other by folding the shield 50 between the first upper and lower brackets 61, 62 after the first upper and lower brackets 61, 62 are connected side by side on the peripheral edge part 53 of the shield member 50. According to this configuration, the operation of forming the sheet-like shield 50 into a tubular shape to cover the wires 40 is facilitated.

With the first upper and lower brackets 61, 62 assembled with each other, the pair of first shield connecting portions 64 may be arranged to face each other and the shield 50 may be wound around the wires 40 over the entire circumference. According to this configuration, the operation of winding the sheet-like shield 50 around the wires 40 is facilitated. Further, shielding performance by the shield 50 can be enhanced.

With the first upper and lower brackets 61, 62 assembled with each other, the pairs of first case connecting portions 65 may be fastened together to the case while being overlapped with each other. According to this configuration, the number of bolting operations to the case is reduced, wherefore the operation of connecting the first upper and lower brackets 61, 62 to the case is facilitated.

The first shield connector 20 may include the first housing 21 made of resin and the first terminals 22 connected to first end parts of the wires 40 and integrally formed with the first housing 21, and the second shield connector 30 may include the second housing 31 made of resin and the second terminals 32 connected to the second end parts of the wires 40 and integrally formed with the second housing 31.

In the wiring harness 10 in which the first and second terminals 22, 32 connected to the opposite end parts of the wires 40 are formed integrally with the first and second housings 21, 31, the tubular shield 50 cannot be mounted around the wires 40 in advance. That is because, if the tubular shield member is mounted around the wires in advance after the first terminals are formed integrally with the first housing, the shield stands as an obstacle and resin molding cannot be performed due to the short wires even if an attempt is made to form the second terminals integrally with the second housing. Further, even if it is attempted to mount the tubular shield around the wires later after the first and second terminals are formed integrally with the first and second housings, the first and second housings stand as an obstacle and the shield cannot be mounted. In that respect, since the sheet-like shield 50 is mounted around the wires 40 later according to the above configuration, the shield 50 does not stand as an obstacle in performing resin molding.

Further, the shafts 91B of the bolts 91 can be mounted radially mounted into the first shaft holes 77 by being introduced through the lateral introducing hole 79A and the longitudinal introducing hole 79B in this embodiment. Thus, the second upper bracket 71 can be mounted later after the wires 40 are arranged.

The second case connecting portions 76 may be respectively provided on the opposite ends of the second upper bracket 71, the introducing direction of the shaft 91B in the lateral introducing hole 79A of one of the second case connecting portions 76 and that of the shaft 91B in the longitudinal introducing hole 79B of the other second case connecting portion 76 may be arranged to intersect and the shaft 91B may be insertable into the longitudinal introducing hole 79B of the other second case connecting portion 76 when the other second case connecting portion 76 is rotated about the first shaft hole 77 of the one second case connecting portion 76 with the shaft 91B arranged in the first shaft hole 77 of the one second case connecting portion 76. According to this configuration, the second upper bracket 71 can be mounted by an easy operation of rotating the other second case connecting portion 76 about the first shaft hole 77 of the one second case connecting portion 76. Therefore the second upper bracket 71 can be mounted reliably on the shaft 91B of the bolt 91 even in an environment where the second upper bracket 71 is difficult to see due to the wires 40.

The second case connecting portion 76 of the second lower bracket 72 may include the separation preventing piece 76A for preventing the separation of the second upper bracket 71. According to this configuration, the separation of the second upper bracket 71 can be prevented by the separation preventing piece 76A with the second lower bracket 72 mounted below the second upper bracket 71.

The metal plate 90 for mounting the second upper and lower brackets 71, 72 on the case may be provided, the second case connecting portions 76 of the second lower bracket 72 may include the first and second positioning pieces 76B and 76C for positioning the second lower bracket 72, and the metal plate 90 may include the cut portion 92B to be locked to the second positioning piece 76C. According to this configuration, the second lower bracket 72 can be positioned by locking the second positioning piece 76C to the cut portion 92B.

Figure 21:
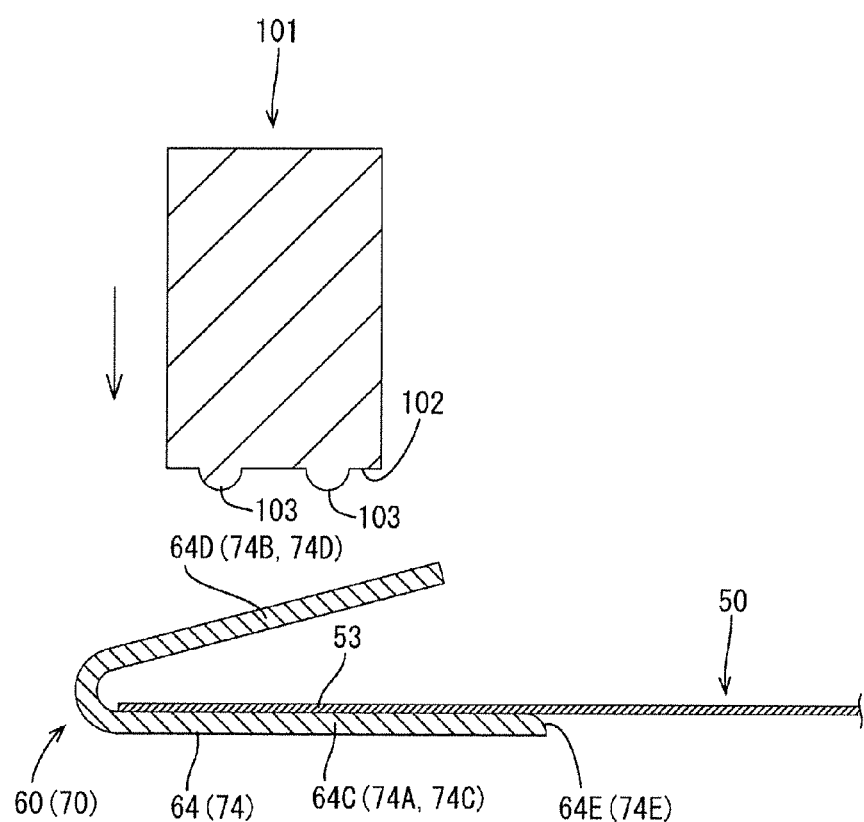
FIG. 21 is a perspective view simply showing a state before the shield connecting portion is crimped to the peripheral edge part of the shield by a crimper in a modification.
Figure 22:
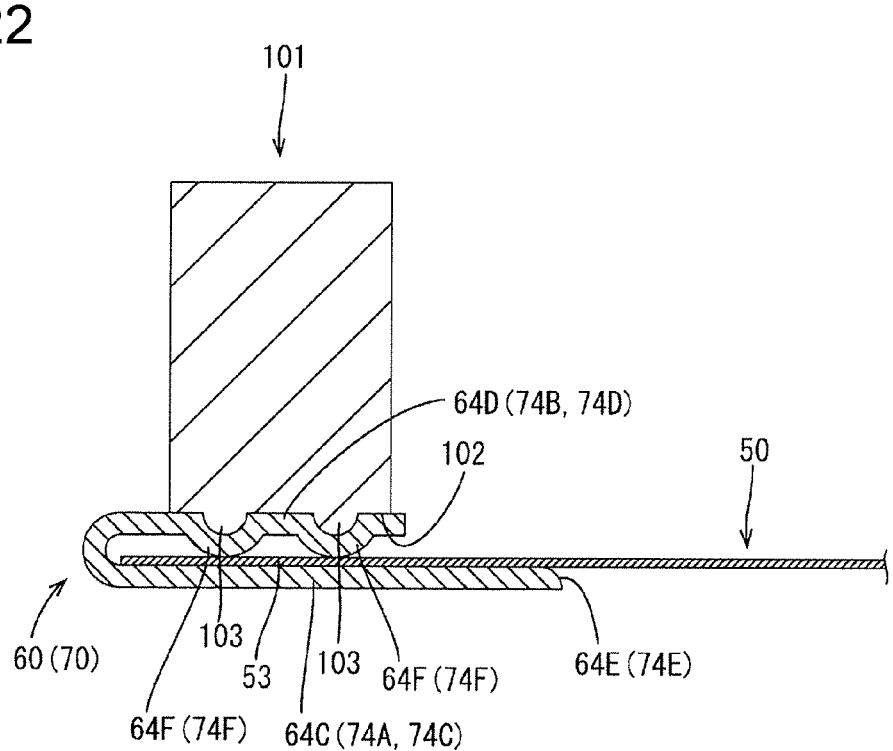
FIG. 22 is a perspective view simply showing a state where the shield connecting portion is crimped to the peripheral edge part of the shield by the crimper in the modification.
Figure 23:
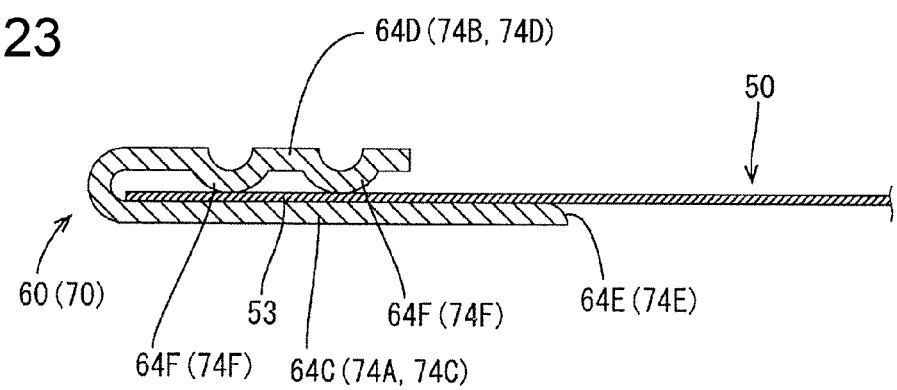
FIG. 23 is a perspective view simply showing a state after the shield connecting portion is crimped to the peripheral edge part of the shield by the crimper in the modification.

Next, a modification of the present invention is described with reference to FIGS. 21 to 23. In this modification, the first bracket 60 is crimped using a crimper 101 whose configuration is changed partly from that of the crimper 100 of the embodiment. Note that although not shown, the second bracket 70 may also be crimped by the crimper 101.

Crimping ribs 103 are formed on a crimping surface of the crimper 101. Thus, when the first bracket 60 is crimped to the peripheral edge part 53 of the shield 50 by the crimper 101, the first crimping piece 64D is thrust toward the first base plate 64C by the crimping ribs 103 and the peripheral edge part 53 of the shield 50 is sandwiched at a high pressure between these thrust parts and the first base plate 64C. Therefore, the detachment of the shield 50 from the first bracket 60 can be reliably prevented.

The technology disclosed by this specification is not limited to the above described and illustrated embodiment. For example, the following modes also are included.

Although the shield 50 is connected to the case via the bracket in the above embodiment, it may be directly connected to the case.

Although the sheet-like shield 50 is wound around the wires 40 into a tubular shape in the above embodiment, it may be mounted to cover the wires 40 from a side opposite to the case and need not be formed into a tubular shape if the wires 40 are arranged along the outer surface of the case.

Although the two brackets 61, 62 are formed into a tubular shape by being bolted to the case in the above embodiment, an integrated bracket in which two brackets are formed integrally via a hinge may be prepared and formed into a tubular shape by folding the hinge in mounting the integrated bracket around the wires 40 later.

Although the two brackets 61, 62 are fastened together to the case in the above embodiment, two brackets may be bolted separately bolted to the case according to the present invention.

Although the terminals 22, 32 are held by being integrally formed with the housings 21, 31 in the above embodiment, terminals may be retained by locking lances provided in the housings.

Although the respective introducing holes 79A, 79B of the second upper bracket 71 are arranged orthogonally in the above embodiment, introducing holes may be arranged in parallel. Specifically, two longitudinal introducing holes may be arranged in parallel by arranging the longitudinal introducing hole instead of the lateral introducing hole.

Although only one separation preventing piece 76A is provided in the above embodiment, plural separation preventing pieces may be provided. Further, the position of the separation preventing piece can be set appropriately according to a separating direction of the second upper bracket.

Although the first and second positioning pieces 76B, 76C are provided in the above embodiment, only one of the positioning pieces may be provided.

LIST OF REFERENCE SIGNS

10 . . . wiring harness
20 . . . first shield connector
21 . . . first housing
22 . . . first terminal
30 . . . second shield connector
31 . . . second housing
32 . . . second terminal
40 . . . wire
50 . . . shield
53 . . . peripheral edge part
60 . . . first bracket
61 . . . first upper bracket
62 . . . first lower bracket
64 . . . first shield connecting portion
65 . . . first case connecting portion
71 . . . second upper bracket
72 . . . second lower bracket
74 . . . second shield connecting portion
76 . . . second case connecting portion
76A . . . separation preventing piece
76B . . . first positioning piece
76C . . . second positioning piece
77 . . . first shaft hole
78 . . . second shaft hole
79A . . . lateral introducing hole
79B . . . longitudinal introducing hole
90 . . . metal plate (mounting plate)
91 . . . bolt
91B . . . shaft
92B . . . cut portion (positioning receiving portion)

The invention claimed is:

1. A wiring harness for connecting a first device and a second device, comprising:
   a first shield connector to be connected to the first device;
   a second shield connector to be connected to the second device;
   a wire arranged between the first and second shield connectors;
   a shield made of an electrically conductive metal cloth, the shield being mounted to cover the wire to provide shielding between the first and second devices; and
   two first brackets made of an electrically conductive metal plate, each of the first brackets having a first case connecting portion to be bolt-connected to a first case that defines an outer surface of the first device and each of the first brackets further having a first shield connecting portion to be connected to the shield, wherein the two first brackets are assembled with each other by folding the shield between the two first brackets after two of the first shield connecting portions are connected side by side on a peripheral edge part of the shield.

2. The wiring harness of claim 1, wherein the two first shield connecting portions are arranged to face each other and the shield surrounds the wire over an entire circumference with the two first brackets assembled with each other.

3. The wiring harness of claim 1, wherein the two first case connecting portions are fastened together to the first case while being overlapped with each other with the two first brackets assembled with each other.

4. The wiring harness of claim 1, wherein:
   the first shield connector includes a first housing made of resin and a first terminal connected to one end part of the wire and integrally formed with the first housing; and
   the second shield connector includes a second housing made of resin and a second terminal connected to the other end part of the wire and integrally formed with the second housing.

5. The wiring harness of claim 1, comprising a second upper bracket and a second lower bracket including second shield connecting portions to be connected to the shield and second case connecting portions to be connected to a second case constituting an outer surface of the second device, wherein:
   the second case connecting portion of the second upper bracket includes a first shaft hole into which a shaft of a bolt is to be arranged and an introducing hole along which the shaft is to be introduced into the first shaft hole in a radial direction of the shaft, and the second case connecting portion of the second lower bracket includes a second shaft hole into which the shaft is to be inserted in an axial direction of the shaft.

6. The wiring harness of claim 5, wherein the second case connecting portion is provided on each of opposite ends of the second upper bracket, an introducing direction of the shaft in the introducing hole of one of the second case connecting portions and that of the shaft in the introducing hole of the other second case connecting portion are arranged to intersect, and the shaft is insertable into the introducing hole of the other second case connecting portion when the other second case connecting portion is rotated about the first shaft hole of the one second case connecting portion with the shaft arranged in the first shaft hole of the one second case connecting portion.

7. The wiring harness of claim 5, wherein the second case connecting portion of the second lower bracket includes a separation preventing piece for preventing the separation of the second upper bracket.

8. The wiring harness of claim 5, comprising a metal plate for mounting the second upper and lower brackets on the second case, wherein:
    the second case connecting portion of the second lower bracket includes a positioning piece for positioning the second lower bracket and the metal plate includes a positioning receiving portion to be locked to the positioning piece.

\* \* \* \* \*